United States Patent [19]

Tabuchi et al.

[11] Patent Number: 4,575,995
[45] Date of Patent: Mar. 18, 1986

[54] AUTOMATIC PRODUCING APPARATUS OF CHIP-FORM ELECTRONIC PARTS AGGREGATE

[75] Inventors: Makoto Tabuchi; Kiyoshi Imanishi, both of Kyoto, Japan

[73] Assignee: Murata Manufacturing Co., Ltd., Japan

[21] Appl. No.: 599,597

[22] Filed: Apr. 13, 1984

Related U.S. Application Data

[63] Continuation of Ser. No. 250,660, Apr. 3, 1981, abandoned.

[30] Foreign Application Priority Data

Apr. 3, 1980 [JP] Japan .................. 55-44168
Apr. 29, 1980 [JP] Japan .................. 55-58103
Apr. 29, 1980 [JP] Japan .................. 55-58102

[51] Int. Cl.$^4$ .................. B65B 27/10; B65B 47/00
[52] U.S. Cl. .................. 53/591; 53/453
[58] Field of Search .................. 53/452, 453, 467, 469, 53/553–555, 591

[56] References Cited

U.S. PATENT DOCUMENTS

| | | | |
|---|---|---|---|
| 3,857,485 | 12/1974 | Frank | 53/453 X |
| 3,971,193 | 7/1976 | Tardiff | 53/591 |
| 4,279,278 | 7/1981 | Weresch | 53/591 X |
| 4,447,287 | 5/1984 | Hofbauer | 53/591 X |

FOREIGN PATENT DOCUMENTS 1289840 9/1972 United Kingdom .

Primary Examiner—S. J. Heinz
Attorney, Agent, or Firm—Ostrolenk, Faber, Gerb & Soffen

[57] ABSTRACT

Apparatus for automatically producing a strip-like container housing chip-form electronic parts comprising a tape-like housing body provided with housing holes spaced thereon, a chip-form electronic part having no lead wire being housed in each of said housing holes.

According to this automatic producing apparatus, a tape-like housing body is intermittently transported longitudinally, a respective chip-form electronic part being sequentially supplied by a supplying device into each housing hole provided on the housing body in the course of transportation thereof, the housing hole being sealed when the chip-form electronic part has been housed therein by a tape-like cover sheet supplied by a sheet supply device, the cover sheet being applied to the tape-like housing body by a cover sheet applying device, the aggregate of electronic parts thus produced being rolled round a reel of a winding device.

21 Claims, 26 Drawing Figures

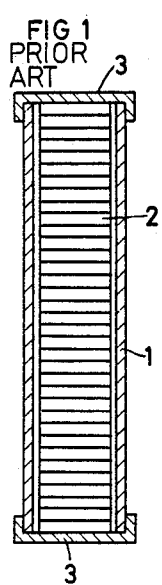
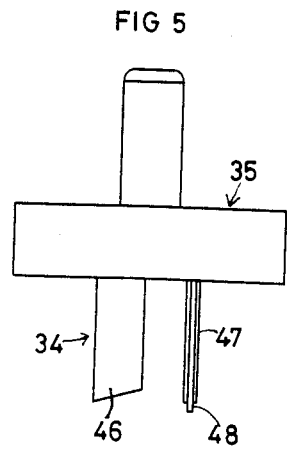
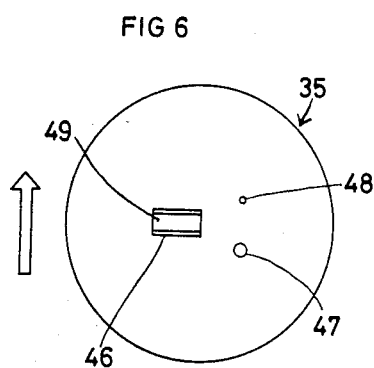
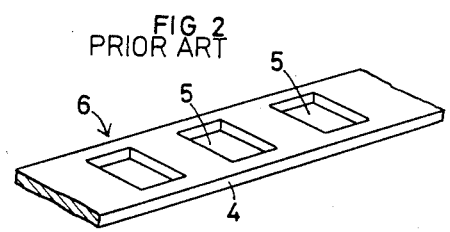
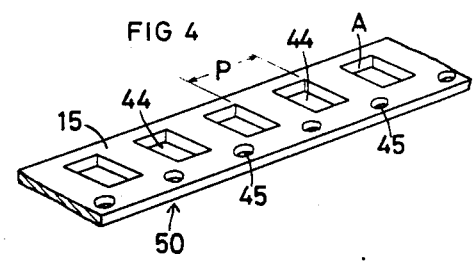
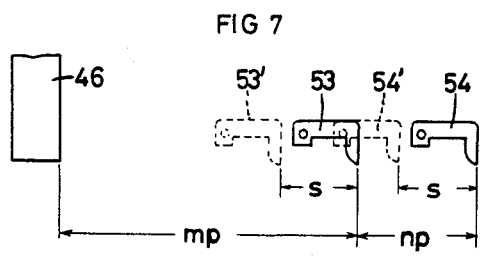

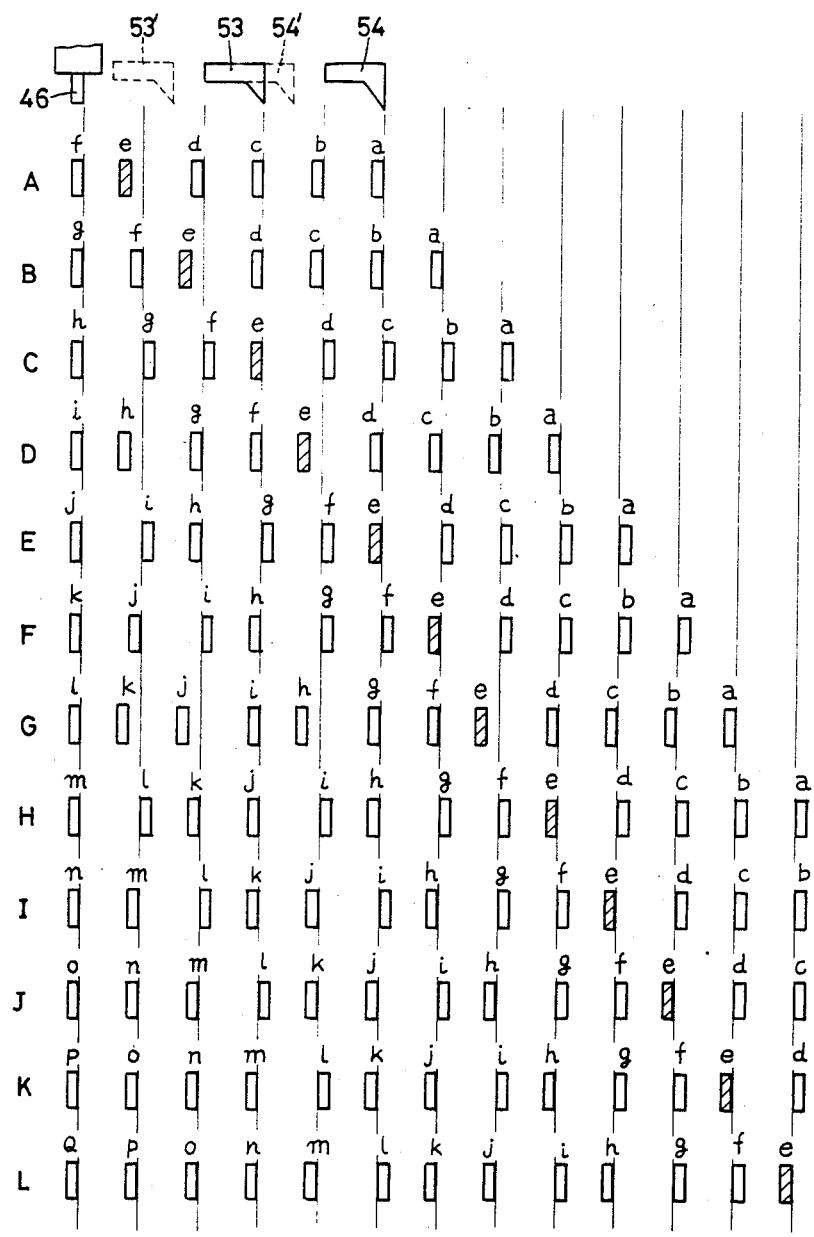

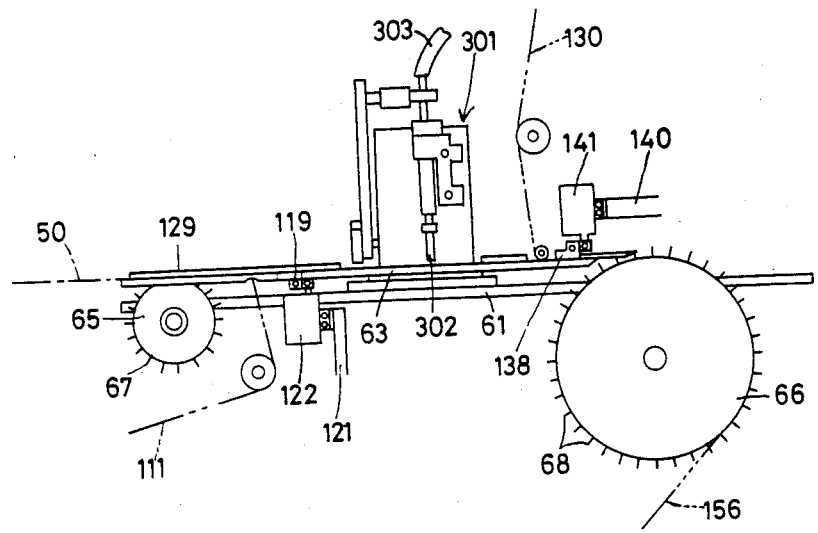
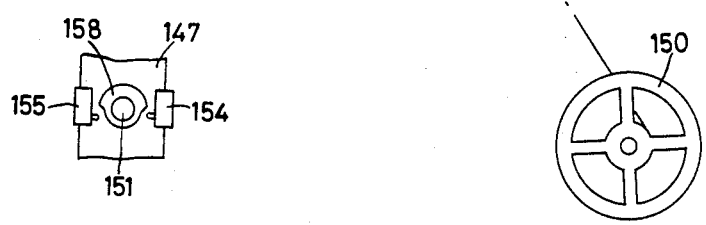
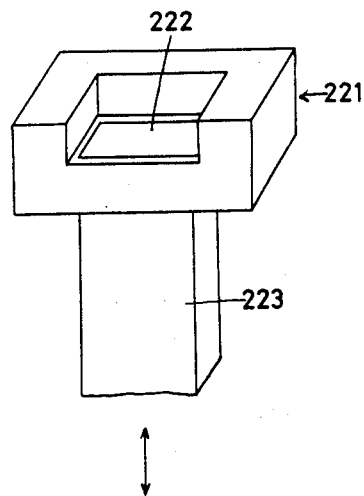

AUTOMATIC PRODUCING APPARATUS OF CHIP-FORM ELECTRONIC PARTS AGGREGATE

This application is a continuation of application Ser. No. 250,660 filed Apr. 3, 1981 which is now abandoned.

BACKGROUND OF THE INVENTION

The invention relates to an automatic apparatus for producing a strip-like container housing chip-form electronic parts formed by sequentially supplying chip-form electronic parts having no lead wire into respective housing holes of a tape-like housing body.

Recently, electronic parts adapted to be directly applied to the conductive zone of a printed circuit board or the like (such as chip-form multi-layer capacitor, resistor, inductance element, etc.) have come into extensive use. In order to automatically mount such chip-form electronic parts on the printed circuit board, there has been utilized so-called magazine system comprising a tubular housing body 1 made of aluminum, plastic, etc., a plurality of chip-form electronic parts 2 layered therein, and each of the open ends of the tubular housing body 1 being sealed by a plug body 3, as shown in FIG. 1.

This magazine system, however, has the following disadvantages. The housing body set in the automatic mounting machine has to be replaced frequently since the electronic parts housed therein are limited in number. Moreover, the electronic parts are liable to be damaged on the surface thereof when supplied to the housing body or taken therefrom since the electronic parts are housed in direct contact with each other.

In order to obviate such disadvantages, there has been proposed a tape system using a tape-like housing body 6 comprising a tape-like member 4 made of flexible material, such as plastics, cardboard, etc., and provided with a plurality of holes 5 with or without bottoms as shown in FIG. 2, a chip-like electronic part being placed in each of the housing holes 5, the opening of the holes 5 being sealed by a cover sheet, such as transparent tape or the like, the tape-like housing body 6 being wound round a reel.

The tape system makes it possible to supply a fairly large number or electronic parts simply by the use of a reel of a large diameter. The tape system has a further advantage in that the electronic parts are free from damage since they are placed in the housing holes independently of each other.

According to the tape system, however, each of a plurality of independent housing holes is loaded with an electronic part one by one unlike the conventional magazine system in which a plurality of electronic parts are placed simply in layers. Thus the loading operation is complicated and by no means feasible manually.

BRIEF DESCRIPTION OF THE INVENTION

The present invention is directed towards an apparatus comprising:

an intermittent feed device for intermittently feeding a tape-like housing body having a plurality of housing holes formed therein at predetermined intervals;

a loading device provided along the travelling path of the tape-like housing body and adapted to load a respective chip-form electronic part into each of the housing holes;

a cover sheet supply device for supplying at least one tape-like cover sheet to the surface of the tape-like housing body so as to enclose each said housing hole after a respective chip-form electronic part has been placed therein;

a cover sheet adhereing device for adhering said at least one cover sheet to said housing body so as to form a strip-like container housihg chip-form electronic parts; and a winding device for winding the strip-like container around a reel.

The present invention is further directed towards an apparatus comprising:

a punching device for forming a tape-like housing body by punching a plurality of through holes in a tape member at predetermined intervals;

an intermittent transport device for intermittently transporting the tape-like housing body along a travelling path defined by a rail;

a chip-form electronic part loading device provided along the travelling path for loading a respective chip-form electronic part into each through hole as the through hole reaches a chip insertion position;

first and second cover sheet supplying devices for supplying first and second tape-like cover sheets to the upper and lower surfaces, respectively, of the tape-like housing body for covering the through holes thereof;

cover sheet adhering devices for adhering said first and second cover sheets to the upper and lower surfaces of the tape-like housing body, respectively, thereby forming a strip-like container housing chip-form electronic parts; and a winding device for taking up the strip-like container around the reel.

A first object of the invention is to provide an apparatus capable of producing with efficiency and reduced labor strip-like container housing chip-form electronic parts by automatically loading a respective electronic part into each of a plurality of housing holes on a tape-like housing body and then sealing the housing holes sequentially.

A second object of the invention is to provide an apparatus capable of producing with efficiency and reduced labor strip-like container housing chip-form electronic parts aggregate by automatically forming housing holes in the tape member, loading electronic parts into the housing holes, and sealing the housing holes subsequently.

A third object of the present invention is to provide an apparatus simple in contruction and capable of producing a strip-like container housing chip-form electronic parts with precision and in sequence.

A fourth object of the present invention is to provide an apparatus capable of loading a chip-form electronic part into each of the housing holes of the tape-like housing body with precision.

A fifth object of the present invention is to provide an apparatus capable of restoring the pitch at which the through hole are formed relative to a tape member to the predetermined pitch, whenever a deviation arises, automatically and within a short period of time.

A sixth object of the present invention is to provide an apparatus capable of winding a strip-like container housing tape-like electronic parts at it is transported intermittently, round a reel with a predetermined tension.

BRIEF DESCRIPTION OF THE DRAWING

These and other objects are accomplished by the parts, improvements, combinations and arrangements comprising the invention, preferred embodiments of which are shown by way of example in the accompanying drawings and herein described in detail.

FIG. 1 is a longitudinal sectional view of the principal part of the conventional magazine system chip-form electronic part housing body.

FIG. 2 is a fragmentary perspective view of the conventional tape-like housing body.

FIG. 4 is a fragmentary perspective view of a tape-like housing body formed by the automatic producing apparatus of the present invention.

FIG. 5 is an elevational view of the upper metal mold of the punching device of the automatic producing apparatus according to the invention.

FIG. 6 is a bottom view of the upper metal mold.

FIG. 7 is a diagram showing the locational interrelation between the intermittent transportation device and the punching device of the automatic producing apparatus according to the invention.

FIGS. 8 and 9 are diagrams showing the punching process for the description of the automatic restorability of the punching device.

FIG. 21 is a perspective view, on a magnified scale, of a receiving table for use with the same.

FIG. 23 is an elevational view showing a third embodiment of the chip-form electronic part supply device.

FIG. 24 is an elevational view showing the cam part in the winding device of the tape-like electronic parts aggregate.

DETAILED DESCRIPTION OF THE PREFERRED EMBODIMENT

Figure 3:
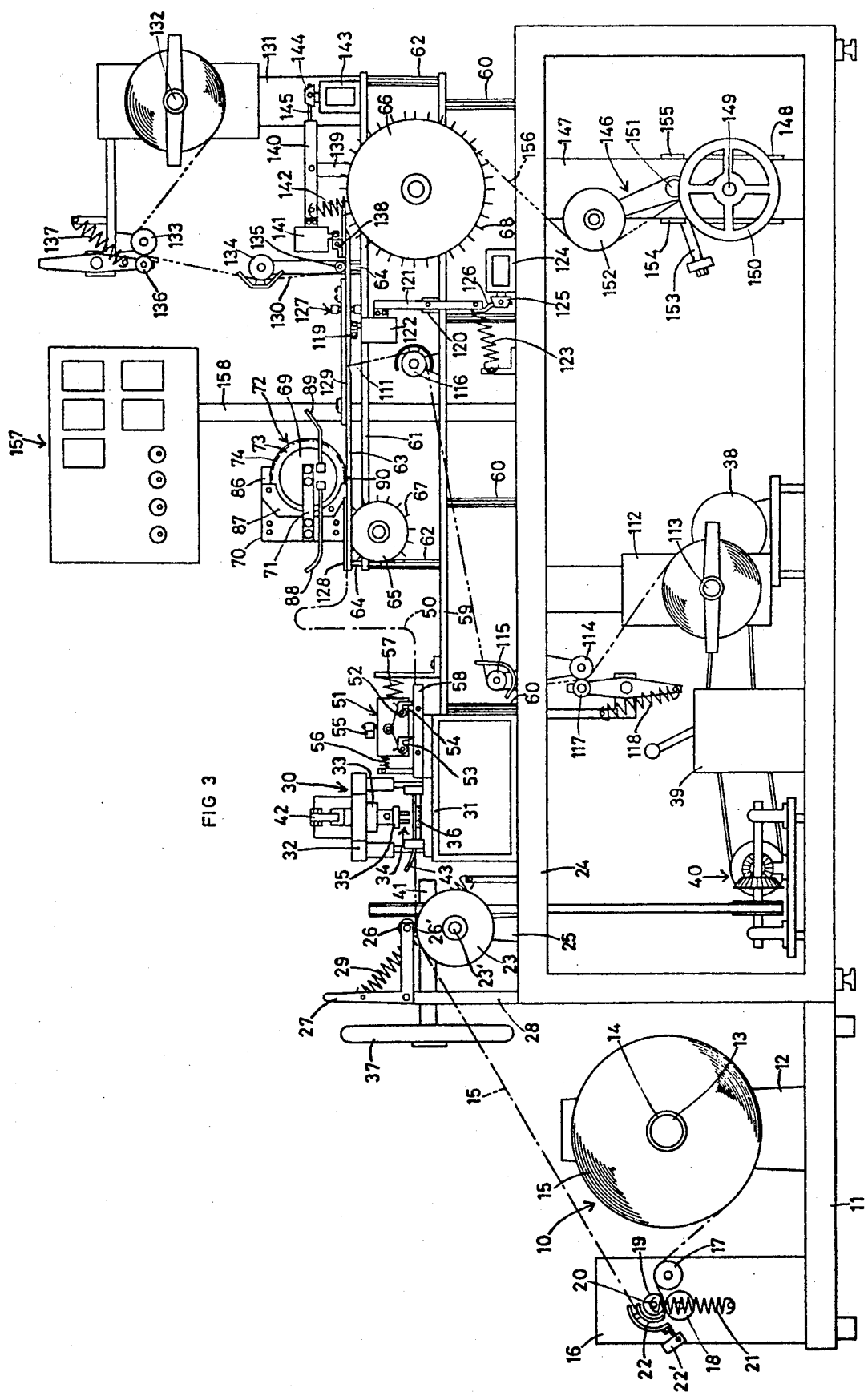
FIG. 3 is an elevational view showing the automatic producing apparatus according to the invention.

Referring to FIG. 3, the numeral 10 designates a tape member supply device in which a tape member 15 made of flexible material having, such as plastics, paper and the like, and, having a predetermined thickness, is wound around a reel 14 which is rotatably mounted on an axis body 13 of a support 12 provided on a mounting table 11. The said tape member 15 is fed through guide rolls 17, 18, 19 provided on a support 16 erected on the mounting table 11.

The roll 18 is driven by a motor (not shown), while the roll 19 is mounted on the support 16 so as to rotate on a fulcrum away from its center axis 20 and is attracted toward the roll 18 by a tensile coil spring 21. Thus the tape member 15 is held between the rolls 18, 19 thereby enabling it to be withdrawn from the reel 14. The rotating speed of the roll 18 is predetermined so that the feeding speed of the tape member 15 is higher than the speed of the subsequent intermittent feeding operations which will hereinafter be described in detail. Thus the tape member 15 withdrawn by the guide rolls 17,18,19 slackens, thereby lifting an arcuate guide 22 provided rotatably at one end thereof on the support 16, so as to cover the guide roll 19. On one end of the guide 22 fixed to the support 16 there is provided a micro-switch 22' for controlling the motor driving the roll 18. Thus the guide 22, when lifted by the slack of the tape member, pushes the switch 22', the power source of the motor is shut with the result that, the feed of the tape member 15 is suspended. Even when the feed is suspended, the slackened tape member 15 is fed by the intermittent feed device of the subsequent process. While the slack is thus eliminated, the guide 22 is restored to its original position by the attraction of the tape member 15 thereby causing the motor for rotating the roll 18 to be driven again. By the repetition of the aforesaid operation, the tape member feeding device 10 feeds the tape member 15 smoothly to the subsequent process.

The numeral 23 designates a guide roll provided on a support 25 erected on the mounting table 24 for guiding the tape member 15 fed from the tape member feed device 10. The numeral 26 designates a guide roll provided on an L-shaped member 27 which is rotatably mounted on a support 28, the roll 26 being attracted toward the roll 23 by a tensile coil spring 29. The rolls 23, 26 are provided with a switching mechanism which is capable of detecting the presence and absence of the tape member 15 between them. To be more precise, the rolls 23, 26 are composed of metallic bodies electrically insulated from the center axes 23', 26', respectively. When the tape member is present between the rolls 23, 26, the switch contact is open. It is closed when the tape member is no longer present between the two rolls 23, 26. This mechanism actuates an alarm for urging the supply of the tape member 15 or cutting the main power source of the automatic producing apparatus. The numeral 30 designates a punching device provided on a frame body 31 having predetermined height for forming housing holes on the tape member 15.

The punching device 30 comprises a punch 35 having a punching rod 34 fixed to a holder 33 mounted on a die set 32 and a die 36 having a hole of a predetermined size provided below the punch 35. The punch 35 is driven by a drive shaft 41 (illustrated in part) provided with a hand-operated handle 37 at one end thereof. The shaft 41 is rotated at a predetermined speed by a motor 38 provided in the lower part of the mounting table 24 and connected to shaft 41 via a transmission 39 and gearing 40. In effect, the upper metal punch 35 is vertically reciprocated by the forward end of a lever 42 driven by an eccentric cam (not shown) fitted to the drive shaft 41 thereby forming a through hole in the tape member 15 which is guided onto the lower metal punch 36 through the rolls 23, 26 and which is lightly pressed by a pressure plate 43.

There are two types of through holes formed in the tape member as shown in FIG. 4; that is, a housing hole 44 for housing a chip-form electronic part and a feed hole 45 provided on one side of the housing hole 44. The upper metal punch 35 and the lower metal punch 36 are so constructed that the required holes are adequately formed.

FIGS. 5 and 6 are a side view and a bottom view of the upper metal punch, respectively. As is clear from the drawings, the upper metal punch 35 is provided with a punching rod 46 for forming a housing hole 44, a punching rod 47 for forming a feed hole 45 and a punching rod 48 having a smaller diameter and a greater length than the punching rod 47 for positioning the tape member 15 at the time of punching. The forward end of the punching rod 46 is tapered so that the housing hole 44 may be punched through the tape member 15 from the side designated by (A) in FIG. 4, a groove 49 being provided on the forward end face of the punching rod 46 along the taper. The punching rod 46 is thus constructed in order to preclude the occurrence of jags on the cut face of the tape member 15 or exfoliation of the laminate when the tape member 15 consists of cardboard. It is not necessary to construct the punching rod 46 in this manner when the the jags and exfoliation, if in a slight degree, are negligible. The punching rod 47 for forming a feed hole 45 is provided so as to be located behind the punching rod 46 for forming the housing hole relatve to the travelling direction of the tape member 15 (indicated by arrow in FIG. 6), the punching rod 48 for positioning being provided so as to be located forwardly of the punching rod 46 relative to the travelling direction of the tape member 15. Each of the punching rods 47, 48 performs a punching operation at the initial punching in the forward end of the tape member 15. Once a feed hole 45 is formed, however, only the punching rod 47 performs further punching operations, the punching rod 48 merely being inserted into a feed hole 45 which has already been punched so as to preclude any unpredictable displacement of the tape member when the housing hole 44 and the feed hold 45 are punched therein. As a result, the housing holes 44 and the feed holes 45 are uniformly spaced on the tape member 15. Thus the tape member 15 is made into a tape-like housing body 50 provided with housing holes for housing chip-form electronic parts, respectively.

Returning to FIG. 3, the numeral 51 designates an intermittent feed device having a pair of L-shaped feeding claws 53, 54 lightly pressed by a spring 52 for intermittently feeding the tape-like housing body along a travelling path. The device 51 is provided on the frame body 31 so as to be movable only longitudinally of the tape-like housing body 50. The intermittent feed device 51 is displaced in the travelling direction of the tape-like housing body 50 by a lever 55 driven by a cylindrical cam (not shown) fitted to the drive shaft 41. It is restored to its original position by a tensile coil spring 56 provided rearwardly thereof and a compression coil spring 57 provided forwardly thereof.

Thus the intermittent feed device 51 is reciprocated by the collaboration of the lever 55 and the spring 56, 57. When it is driven in the travelling direction of the tape-like housing body 50, the feed claws 53, 54 engage the forward ends of the housing holes 44 of the tape-like housing body 50 located thereunder thereby displacing the tape-like housing body 50 in its travelling direction. When the intermittent feed device 51 moves backwardly, the feed claws 53, 54 do not engage the rear ends of the housing holes 44 of the tape-like housing body 50 since the feed claws 53, 54 are provided with tapers on their backs and mounted rotatably, whereby the tape-like housing body 50 once displaced forwardly is never carried backwardly.

As described hereinabove, the intermittent feed device 51 intermittently feeds the tape-like housing body 50 only longitudinally in the travelling direction thereof, while causing the tape member supply device 10 to feed a new tape member 15, and enabling the punching device 30 to effect continuous punching. Since the two feed claws 53, 54 of the intermittent feed device 51 are provided in such positions as will satisfy the predetermined conditions relative to the punching rod 46 for forming housing holes 44 in the tape-like housing body 50, the feed pitch of the tape-like housing body 50, even when temporarily disordered due to some external disturbance, is restored to its normal state within a short period of time thereby enabling the housing holes 44 formed by the punching rod 46 to have a predetermined spacing therebetween. The predetermined conditions of the feed claws 53, 54 relative to the punching rod 46 are as follows. Referring to the schematic diagram shown as FIG. 7, the feed claws 53, 54 shown by solid lines are located in the positions after displacement in the travelling direction of the tape-like housing body 50, the distance between the punching rod 46 and the feed claw 53 being represented by mp, while the distance between the feed claws 53 and 54 are represented by np (m and n represent the numbers of the housing holes, respectively, while p represents the pitch of the housing holes 44). See FIG. 4. The feed claws 53', 54' shown by dotted lines illustrate the location of the feed claws after they have been restored to this original position by springs 56, 57. When the distances (strokes) between the feed claws 53', 54' and the forwardly displaced feed claws 53, 54 are represented by s respectively, the numbers m, n of the housing holes 44 are both natural numbers, and the value obtained by dividing the sum of m and n by n is a sum of a natural number and a decimal, the stroke s being larger than the pitch p of the housing holes 44 and smaller than twice as long as the pitch p. When such conditions are established, the intermittent feed device 51 exhibits a high efficiency as described above. The conditions are not essential when the external disturbance is nil or negligible, or when the size of the housing hole 44 is sufficiently large compared with that of the electronic part to be stored therein. A single feed claw may suffice in such a case.

The manner in which the pitch aberration is rectified according to the invention will be described in detail with reference to FIG. 8 which shows the process of recovery when the housing hole e marked with oblique lines has been formed with a greater pitch than the predetermined value p relative to the preceding housing hole d (the longitudinal lines show the pitch p) due to some external disturbance. The stroke s of a pair of feed claws 53, 54 shown in FIG. 7 is predetermined so as to be larger than the pitch p of the housing holes, m and n representing the numbers of the housing holes being predetermined as 3 and 2, respectively.

Process A shows the state in which the tape member has been displaced in its travelling direction with the fed claws 53, 54 engaging the forward end parts of the housing holes c, a after the housing hole e was formed in the preceding process. The housing hole f, though formed in the predetermined position, has a smaller pitch relative to the preceding housing hole e due to its pitch aberration. Then the tape member is displaced in its travelling direction with the feed claws 53, 54 engaging the housing holes d, b. The housing hole g formed in the process B has the predetermined pitch.

Figure 9:
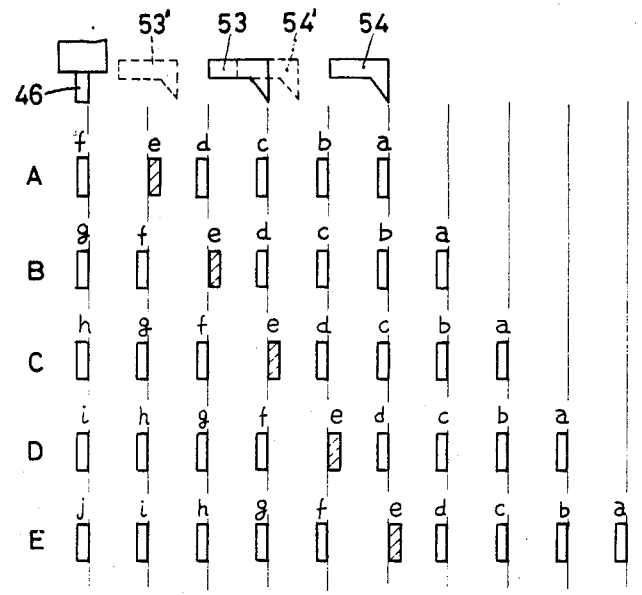
Figure 10:
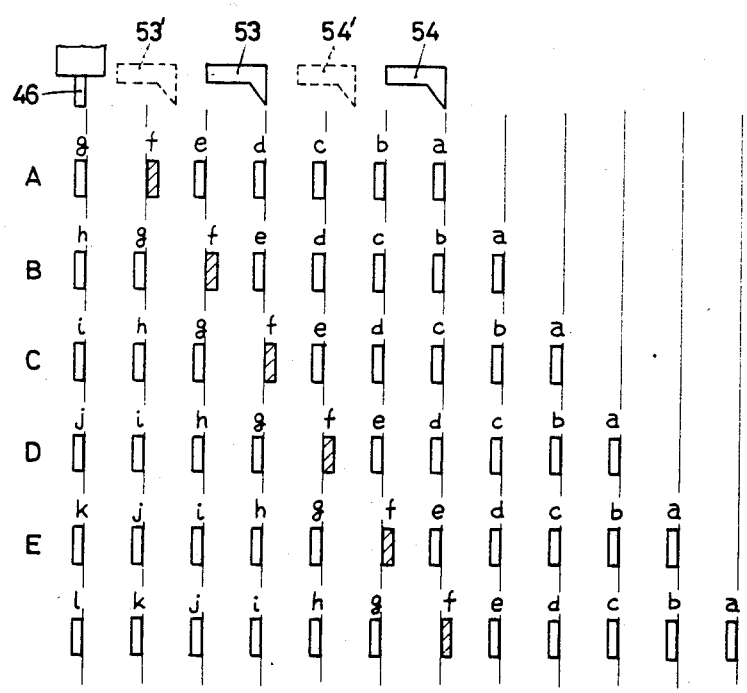
FIGS. 10 and 11 are diagrams showing the punching process by the punching device not in conformity with the invention.
Figure 11:
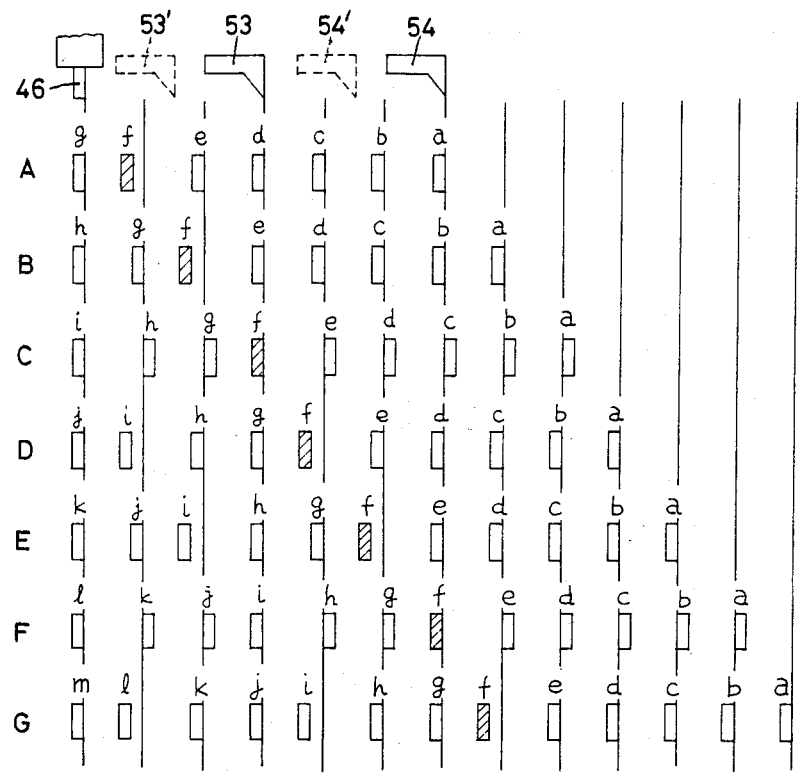
Figure 12:
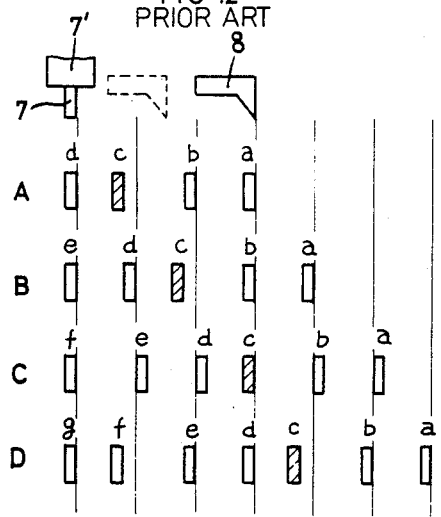
FIG. 12 is a diagram showing the punching process of the conventional punching device.

The feed claws 53, 54 primarily engage the housing holes e, c, respectively in the process B. However, since the housing hole e has a greater pitch relative to the preceding housing hole d, the feed claw 53 only engages the housing hole e thereby displacing the tape member in its travelling direction. Then the displacement pitch is, as is understandable from the drawing, greater than the predetermined value. Thus the housing hole h formed in the process C has a greater pitch relative to the preceding housing hole g. Then the feed claws 53, 54 engage the housing holes f, d, respectively, thereby feeding the tape member, the housing hole i being formed in the process D. The housing hole i, since the feed pitch is smaller, has a smaller pitch relative to the preceding housing hole h. Then the feed claws 53, 54 primarily engage the housing holes g, e. However, due to the aberration of the pitch of the housing hole e, the feed claw 54 only engages the housing hole e thereby displacing the tape member forwardly to the next process E. Thus one or both of the feed claws engage the forward end parts of the housing holes thereby feeding the tape member forwardly to the next process in sequence. It will be understood from the drawing that the predetermined pitch is restored for all the housing holes formed in and after the process I. FIG. 9 shows how the predetermined pitch is restored when the housing hole e has been formed with a smaller pitch relative the preceding housing hole d due to some external disturbance. The two feed claws 53, 54 are of the same construction as in the case of FIG. 8. It will be understood from FIG. 9 that the predetermined pitch is restored for all the housing holes formed in and after the process B. FIGS. 8 and 9 describe the case only when m and n representing the numbers of the housing holes are 3 and 2. However, insofar as the aforesaid conditions are satisfied, the same result is obtainable whatever values are represented by m and n. This will be made apparent by drawing diagrams in the same manner as FIGS. 8 and 9. FIGS. 10 and 11 show examples in which the value of both m and n is 3, that is, the said predetermined conditions are not satisfied. When the housing hole f has a smaller pitch relative to the preceding housing hole e as shown in FIG. 10, the predetermined pitch is quickly restored. On the contrary, when the housing hole f has a larger pitch relative to the preceding housing hole e as in the case of FIG. 11, it is apparent that the predetermined pitch is by no means restored inasmuch as the arrangement of the housing holes in the process D is identical with that in the process G in the section in which the feed claws 53, 54 are present. Though FIGS. 10 and 11 show the cases in which m and n represent 3 respectively, it will be easily understandable by drawing diagrams in the same manner that the predetermined pitch is never restored regardless of the value insofar as the said conditions are not satisfied. FIG. 12 shows an example of the punching process in the case of a single feed claw. It will be understood from the drawing that the pitch aberration is repeated in a fixed cycle.

Referring again to FIG. 3, the numeral 58 designates a rail provided with a longitudinal groove thereon for preventing the tape-like housing body 50 from being transversely displaced in transit. The numeral 59 designates a first stage provided on the mounting table 24 with interposition of a plurality of supports 60, 61 designating a second stage provided on the first stage 59 with interposition of a plurality of supports 62, 63 designating a rail provided on the second stage 61 by means of a support 64, a groove for housing the tape-like housing body 50 being formed longitudinally on the surface of the rail 63. The numerals 65, 66 designate a pair of sprocket wheels comprising a pair of disks provided with a plurality of pins 67, 68, respectively spaced on the peripheries thereof, and rotatable by a barrel cam (not shown) fitted to the drive shaft 41. The sprocket wheels 65, 66 constitute an intermittent feed device for intermittently feeding the tape-like housing body 50 in the travelling direction thereof with the pins 67, 68 engaging the housing holes 45 of said tape-like housing body 50 located in the groove of the rail 63. The numeral 69 designates a circular fixed head secured through a transverse support 71 to a supporting plate 70 mounted on a support on the second stage 61, said circular fixed head 69 being provided above the tape-like housing body 50 in the groove of the rail 63 and perpendicularly relative to the plane thereof. The numeral 72 designates a chip-form electronic part loading body comprising an annular rotary body 73 rotatably fitted to the outer periphery of the fixed head 69, a plurality of chip-form electronic part housing grooves 74 open on one side thereof being spaced on the outer periphery of the annular rotary body 73. The chip-form electronic part loading body 72 is intermittently driven counterclockwise by the barrel cam driving the sprocket wheels 65, 66 as shown in FIG. 3.

Figure 14:
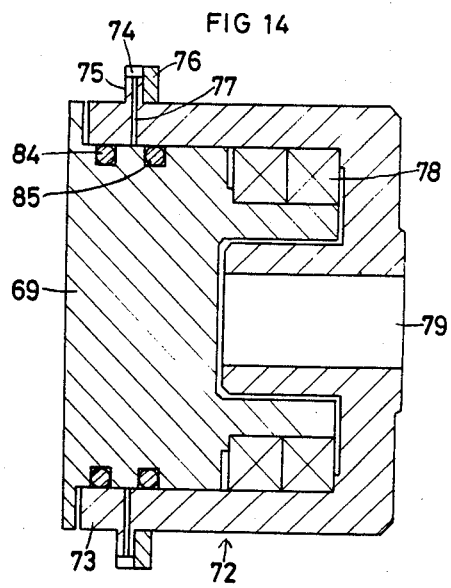
FIG. 14 is a longitudinal sectional view showing the state in which the chip-form electronic part loaded body has been fitted onto a fixed head.
Figure 15:
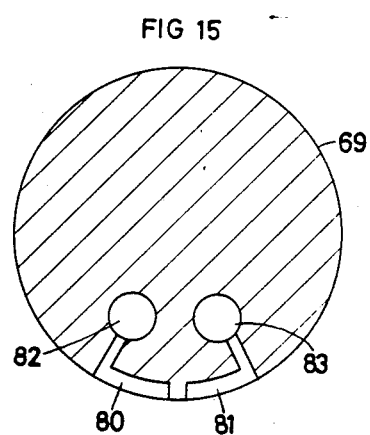
FIG. 15 is a longitudinal sectional view of the fixed head.

The construction of the fixed head 69 and that of the loading body 72 will be described in more detail in reference to FIGS. 14 and 15. FIG. 14 is a sectional view showing the the chip-form electronic part loading body 72 fitted to the fixed head 69 bearings 78 interposed therebetween. A plurality of grooves 74 are spaced on the outer periphery of the annular projecting wall 75 provided on the outer periphery of the annular rotary body 73 in such manner that the grooves 74 are open at both ends across the annular projecting wall. An annular body 76 of the same height as the projecting wall 75 is fitted to the backside of the projecting wall 75, whereby a chip-form electronic part housing groove 74, open on one side only, is formed. Each housing groove 74 is provided on its bottom face through hole 77 communicating with the inside of the annular rotary body 73. The numeral 79 designates a hole for receiving a drive shaft for rotating the rotary body 73. The fixed head 69 is provided with first and recesses 80, 81 formed along the outer periphery of the bottom side of fixed head 69 and in a position communicating with that through hole 77 location in the bottom face of the housing groove 74 of the loading body 72 as shown by the sectional view of FIG. 15. The recesses 80, 81 are provided with a suction hole 82 and a supply hole 83, respectively, communicating with the front part of the fixed head 69. The numerals 84 and 85 designate O-rings fitted into the grooves provided on the outer periphery of the fixed head 69. The O-rings 84, 85 are disposed with the first and second recesses 80, 81 interposed therebetween so as to have such sealing action that said first and second recesses 80, 81 communicate only with the through hole 77 located in the bottom face of the housing groove 74 of the loading body 72. The construction of the fixed head 69 and that of the loading body 72 are not necessarily limited to those that described hereinabove. For example, the housing groove 74 open at one side may be formed directly on the annular projecting wall 75 without using the annular body 76. The construction is changeable in further particulars in case of necessity.

Referring again to FIG. 3, the numeral 86 designates a first bounce preventive wall provided on the supporting plate 70 so as to cover the housing groove 74 located on substantially half the periphery of the loading body 72 extending from the upper and part including the top to the part adjacent the lower end thereof to prevent the chip-form electronic part housed in the housing groove 74 from bouncing out of the upper opening due to vibrations or spontaneously falling at an unnecessary location. The numeral 87 designates a second bounce preventive wall mounted on the first bounce preventive wall 86 so as to cover the side opening of the housing groove 74 located on substantially half the periphery extending from the upper end part except the top to the part adjacent the lower end of the loading body 72 to prevent the chip-form electronic part housed in the housing groove 74 from slipping out of the lateral opening thereof. The numeral 88 designates a suction pipe with one end thereof connected to the suction hole 82 (FIG. 15) communicating with the front part of the fixed head 69 and the other end thereof connected to a vacuum source (not shown), 89 designating a supply pipe with one end thereof connected to the supply hole (FIG. 15) communicating with the front part of the fixed head 69 and the other end thereof connected to an air pressure source (not shown). To be more precise, the chip-form electronic part loading body 72 receives, in the vicinity of its top, chip-form electronic parts through the lateral opening of the housing groove 74 by a vibration supply device described hereinafter, the electronic parts housed at the top being transported to the bottom side by the intermittent counterclockwise rotation of the loading body 72. The electronic part stored at the top, when rotationally transported to a position coinciding with the first recess 80 (FIG. 15) of the fixed head 69, is suctionheld by a suction holding device comprising the first recess 80 and the vacuum source through the through hole 77 of the bottom of the housing groove 74, while the electronic part, when rotationally transported to a position coinciding with the second recess 81 after passing the first recess 80, is forced to fall downwardly by a forcible falling device comprising the second recess 81 and the air pressure source through the through hole 77, whereby the electronic part is loaded into the housing hole 44 of the tape-like housing body 50 on the rail 63 located below. The first and second bounce preventive walls 86, 87 can be eliminated by extending the first recess 80 provided on the fixed head 69 to adjacent the top thereof. Since the electronic part to be loaded into the housing hole of the tape-like housing body 50 is accelerated by the forcible falling device, wind pressure is created between the bottom of the electronic part and the surface of the rail 63 in the housing hole of the tape-like housing body 50, whereby the normal loading is prevented. In order to obviate this difficulty, a vent hole 90, whose shape does not permit the passage of the chip-form electronic part is formed in the part of the rail 63 coinciding with the position of the housing hole of the tape-like housing body 50 at the falling point of the chip-form electronic part thereby enabling the housing hole to be normally loaded with the electronic part.

Figure 18:
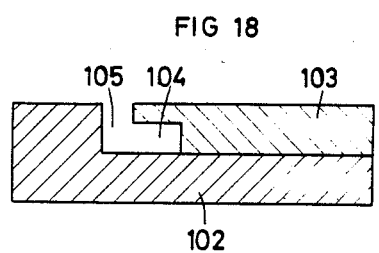
FIG. 18 is a longitudinal sectional view of a linear track constituting part of the vibration supply device.
Figure 16:
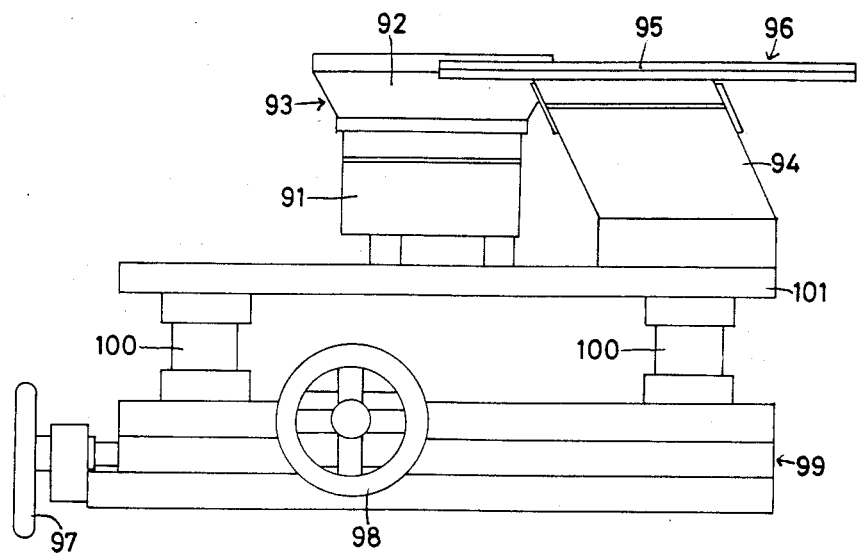
FIG. 16 is an elevational view of a vibration supply device.
Figure 17:
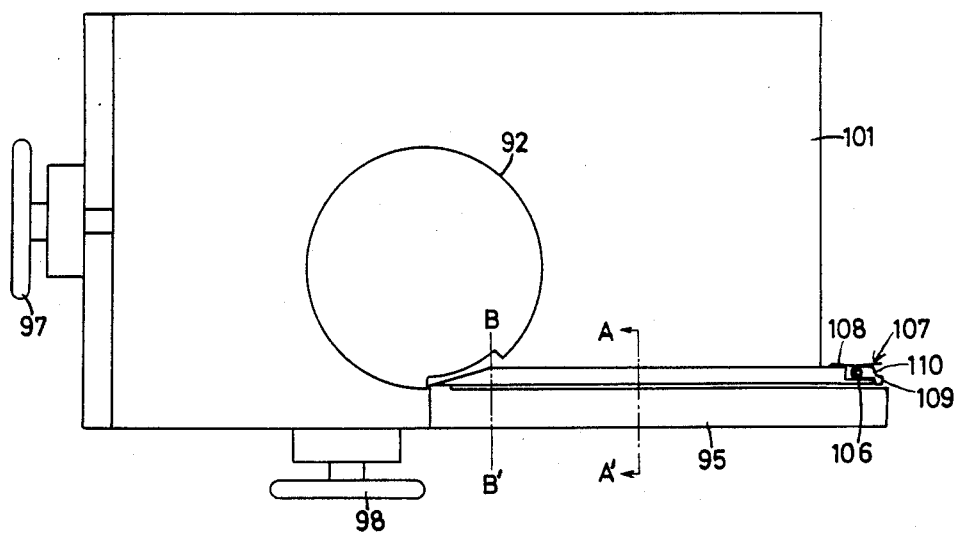
FIG. 17 is a plan view of the same.

The vibration supply device for supplying the chip-form electronic part into the housing groove 74 of the housing body 72, as shown in FIGS. 16 and 17, comprises a dish ball feeder 93 consisting of a first vibrator 91 and a dish ball 92 (contour only is shown in FIG. 17) connected therewith and a linear feeder 96 consisting of a second vibrator 94 and a linear track 95 connected therewith. The vibration supply device is installed on a flat plate 101 mounted on a X-Y table 99 provided with control handles 97, 98 via a plurality of dampers 100. The dish ball feeder 93 aligns a plurality of chip-form electronic parts supplied to the center of the dish ball 92 in a predetermined direction by the vibration of the vibrator 91 until they are fed to the outlet. The linear feeder 96 is adapted so that the forward end of the linear track 95 is disposed at the outlet of the dish ball 92 so as to receive the electronic parts fed thereto. The electronic parts are fed to the rear end of track 95 by the vibration of the vibrator 94. The linear track 95 has a groove 104 for transporting the electronic parts therethrough, the groove being defined by the combination of lower and upper plates 102, 103 having an L-shaped profile respectively, as shown in FIG. 18 which is an enlarged cross sectional view taken along the line A—A' of FIG. 17. When the lower and upper plates 102, 103 are combined, a gap 105 is formed in the upper part thereby making it possible to observe the movement of the electronic parts in the groove 104. A photoelectric switch (not shown) is provided at the location designated by the line B—B' (FIG. 17) adjacent the forward end of the linear track thereby making it possible to detect the presence of the electronic parts through the gap. The photoelectric switch is adapted to suspend the feed of the electronic parts from the dish ball 92 to the linear track 95 by stopping the vibration of the first vibrator 91 when an electronic part is present in the location where said switch is provided in the groove 104. It will continue the feeding operation by actuating the vibrator 91 only when no electronic part is present in the groove 104. At the rear end of the linear track 95, a claw 107 having the shape as shown in FIG. 17 is rotatably fixed to a pin 106 is provided in the notch of the upper surface of the lower plate 102. The claw 107 is pressed inwardly by a spring 108 thereby causing the forward end 109 to form a groove 104 between the lower and upper plates 102, 103. On the rear side of the forward part 109 of the claw 107 there is formed a notch 110, a reflector type photoelectric switch (not shown) being provided above the notch 110. In the linear feeder 96 thus constructed, the rear end of the linear track 95 is disposed in front of the top of the chip-form electronic part loading body 72 thereby enabling the chip-form electronic parts to be sequentially housed in the housing groove 74 of the loading body 72 from the rear end of the linear track 95 by the vibration of the second vibrator 94.

If the electronic part fails to be snugly housed in the housing groove 74, the electronic part is brought into contact with the loading body 72 rotating counterclockwise thereby causing the claw 107 of the linear track 95 to open outwardly. Thus the electronic part is protected from damage, such as chipping and the like. When the claw 107 at the rear end of the linear track 95 is opened outwardly, the forward end 109 of the claw 107 is present in the notch 110 on the rear side. Then the photoelectric switch above the notch 110 detects the presence of the forward end 109 thereby cutting off the power source of the motor 38. If it is so arranged that compressed air is supplied through a nozzle toward the rear end of the linear track 95 from the gap 105 on the upper surface thereof, the electronic parts in the groove 104 of the linear track may be transported with greater smoothness.

Figure 19:
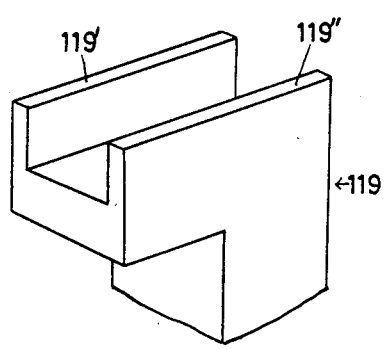
FIG. 19 is a perspective view of the principal part of a heater for applying the cover sheet.

Referring to FIG. 3, the numeral 111 designates a first tape-like cover sheet consisting of a transparent film, such as plastics and the like, wound around a reel rotatably mounted on an axis body 113 of a support 112 in the lower part of the mounting table 24. The cover sheet 111 is drawn up to the upper surface of the rail 63 via a through hole from a cover sheet feeder which feeder comprises a reel rotatably fixed to an axis body 113 of a support 112 in the lower part of the mounting table 24 and guide rolls 114, 115, 116, the cover sheet 111 being disposed on the lower surface of the tape-like housing body 50 loaded with chip-form electronic parts in its housing holes 44 except the feed holes 45. The numeral 117 designates a roll pressed to the guide roll 114 by a coil spring 118, the two rolls 117, 114 constituting a switch in the same manner as in the case of the rolls 23, 26 thereby performing the required actions through the detection of the presence and absence of the tape-like cover sheet 111. The numeral 119 designates a first heat body made of copper or the like provided on the lower surface of the rail 63 and adapted to be heated by a first heater 122 at the forward end of an arm 121 rotatably fixed to a support 120. The heat body 119 is provided in such manner that it is caused to project beyond the upper surface of the rail 63 via the through hole thereof by a tensible coil spring 123 engaged with the rear end of the arm 121. The heat body 119, as shown in FIG. 19, comprises two projecting walls 119′, 119″ provided in parallel at the forward end thereof, the tape-like cover sheet 111 being heated by the projecting walls 119′, 119″ until it is slightly melted and then applied to opposite ends of the housing hole 44 of the tape-like housing body 50. To be more precise, a cover sheet applying device for adhering the first cover sheet 111 to the tape-like housing body 50 is composed of the heat body 119 and the heater 122. The numeral 124 designates a first solenoid electromagnet provided on the mounting table 24, the arm 126 fixed to the forward end of a movable iron core 125 being connected to the rear end of the arm 121 to which the heater 122 is fixed. The electromagnet 124 is excited when the feed of the tape-like housing body 50 is stopped by the sprocket wheels 65, 66 comprising the intermittent feed device by the stoppage or the like of the rotation of the motor 38 thereby causing the heat body 119 projecting beyond the upper surface of the rail 63 to be lowered in order to prevent overmelting of the tape-like cover sheet 111. The numeral 127 designates a projector type photoelectric switch for detecting the presence and absence of the electronic parts in the housing hole 44 of the tape-like housing body 50. A through hole is formed in the part of the rail 63 coinciding with the path of light of the photoelectric switch 127; when an electronic part is present in the housing hole 44, the light is intercepted, while the path of light is formed when no electronic part is loaded (since the cover sheet 111 is transparent) thereby interrupting the power source of the motor 38. The numerals 128 and 129 designate pressure plates provided on the rail 63 for preventing the tape-like housing body 50 from floating upwardly.

The numeral 130 designates a second tape-like cover sheet consisting of a transparent film, such as plastic and the like. The cover sheet 130 is placed on the upper surface of the tape-like housing body 50 loaded with chip-form electronic parts by a roll 135 from the cover sheet supplying device. The sheet 130 is placed on the body 50 in such a manner that is does not cover the feed holes 45. The cover sheet supplying device comprises a reel mounted on an axis body 132 of a support 131 on the second stage 61, the cover sheet 130 being wound around the reel being fed with interposition of guide rolls 133, 134. The numeral 136 designates a roll pressed to the guide roll 133 by a tensile coil spring 137, the roll 136 together with the roll 133 constituting a switch (as in the case of the rolls 23, 26) capable of performing the required action by detecting the presence and absence of the tape-like cover sheet 130. The numeral 138 designates a second heat body made of copper or the like, the second heat body 138 being adapted to be heated by a second heater 141 at the forward end of an arm 140 rotatably fixed to a support 139 and pressed to the upper surface of the rail 63 by a tensile coil spring 142 engaged with the forward end of the arm 140. The second heat body 138 is constructed in the same configuration as that of the first heat body 119, the second heat body 138 being adapted to apply the tape-like cover sheet 130 to opposite ends of the housing holes 44 of the tape-like housing body 50 by slightly melting said tape-like cover sheet 130. In effect, a cover sheet adhering device for adhering the second cover sheet 130 to the tape-like housing body 50 is constituted by the heat body 138 and the heater 141. The numeral 143 designates a second solenoidal electromagnet provided on the second stage 61, an arm 145 fixed to the forward end of the movable iron core 144 thereof being coupled with the rear end of an arm 140 fixed to the heater 141. The electromagnet 143, like the electromagnet 124, is excited when the feed of the tape-like housing body 50 is stopped, the heat body 138 pressed against the upper surface of the rail 63 being lifted thereby preventing excessive melting of the tape-like cover sheet 130. In this embodiment, the cover sheet adhering device for applying the first and second cover sheets 111, 130 onto the tape-like housing body 50 has been described as comprising the heat bodies 119, 138 and the heaters 122, 141. However, the method of adhering the cover sheets to the tape-like housing body is not necessarily limited to such heating means. For example, the cover sheet may be adhering to the tape-like housing body by coating in the process the longitudinal ends of the cover sheet with an adhesive. The cover sheet coated in advance with an adhesive may be used, in which case the adhering device would comprise pressing members like rollers for pressing the cover sheet into the tape-like housing body.

The numeral 146 designates a winding device provided on a support 147 in the lower part of the mounting table 24, the winding device comprising a motor 148 fixed to the back of the support 147, a reel 150 fitted onto a rotary shaft 149 driven by the motor 148, a tension roll 152 rotatably mounted on the axis body 151 of the support 147, a weight body 153 attached integrally to the tension roll 152, and a pair of push-button switches 154, 155 adapted to be actuated by a cam (see FIG. 24), integrally provided on the axis body 151 of the tension roll 152. In this winding device 146, the strip-like container housing chip-form electronic parts 156 comprising a tape-like housing body 50 loaded with chip-form electronic parts in its housing holes 44 with its upper and lower surface being coated with cover sheets 111, 130 is automatically wound round the reel 150 as follows. When the container 156 is fed by the pair of sprocket wheels 65, 66 constituting an intermittent feed device, the tension roll 152 is displaced downwardly by its weight and the weight of the weight body 153 with the axis body 151 as a fulcrum. Then the switch 154 is pushed by the cam 158 (FIG. 24) integrally provided on the axis body 151, the motor 148 being driven thereby causing the container 156 to be wound round the reel 150. When the the container 156 is wound round the reel 150, the tension roll 152 is displaced upwardly by the tension produced in said aggregate 156. When it is displaced to a predetermined position, the switch 155 is pushed by the cam whereby the rotation of the motor 148 is stopped. By the repetition of this operation, the container 156 is automatically wound round the reel 150 without the risk of breakage even by the tension arising at the time of winding. It is to be noted that the construction of the winding device 146 is not necessarily limited to the one described hereinabove. For example, if such motor 148 is selected as is adapted to rotate when the load is below a predetermined value and automatically stop when the load is in excess of said value, a winding device can be constructed simply by fitting the reel 150 onto the axis body driven by said motor. The numeral 157 designates a switchboard provided on the mounting table 24 with interposition of a support 158, said switchboard 157 comprising required meters, switches, timers, etc., thereby enabling to control each of the devices in conformity with the predetermined progam. Though not described in detail heretofore, the guide rolls 17,19,23,114, 115,116,133,134 and 152 are formed with guide grooves on the peripheral surfaces thereof thereby preventing the tape member 15, tape-like housing body 50, first and second cover sheets 111,130 and the container 156 from being detached from the peripheral surfaces of the rolls.

The apparatus for automatically producing a strip-like container housing electronic parts according to the invention is of the construction as described hereinbefore. The apparatus disclosed, however, is not to be construed to restrict the scope of the invention since it is only one possible embodiment of the invention. In effect, the automatic producing apparatus according to the invention is characterized not only by the comprehensive features thereof but also by the features of each individual device constituting the automatic producing apparatus in combination. It is needless to mention that each of the devices constituting the automatic producing apparatus and the combination thereof may be suitably changed when necessary. For example, if a tape-like housing body 50 of which the tape member 15 is preliminarily formed with housing holes 44 is used, the tape member feed device 10, the punching device 30, the intermittent feed device 51 and the like can be removed from the apparatus. In this case, a tape-like housing body feed device having a construction similar to that of the tape-member feed device 10 can be used. The housing hole of the tape-like housing body can be a hole having a bottom instead of a through hole as in the case of the embodiment. When the hole has a bottom, it is necessary that the bottom be provided with a vent hole of a required size, and said vent hole may be utilized as an insertion hole of the terminal of an apparatus for measuring the characteristics of the electronic part in the housing hole. In the embodiment, the first cover sheet 111 to be disposed on the lower surface of the tape-like housing body 50 is supplied after the housing hole of the tape-like housing body 50 has been loaded with an electronic part. However, if the first cover sheet 111 is provided with vent holes, said cover sheet 111 can be supplied prior to loading of the electronic part into the housing hole of the tape-like housing body. It is needless to mention that the first and second cover sheets 111, 130 may be opaque instead of transparent.

Figure 20:
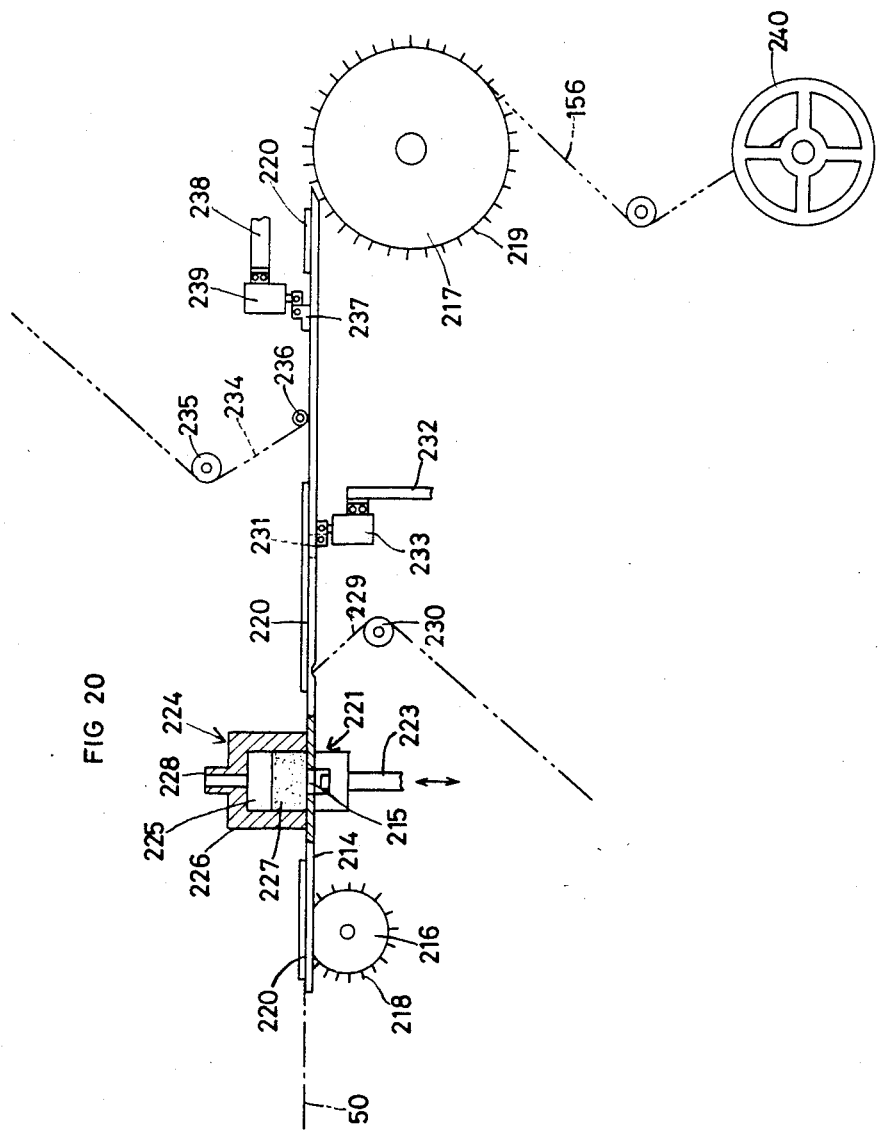
FIG. 20 is an elevational view showing a second embodiment of the chip-form electronic part supply device.

According to the embodiment disclosed, the part in which the chip-form electronic part is automatically loaded into the housing groove of the tape-like housing body consists of the circular fixed head 69 and the chip-form electronic part housing body 72 combined with each other. This part too, however, can be replaced by some other construction. FIGS. 20 and 21 show a second embodiment of the part in which the chip-form electronic part is loaded. The second embodiment comprises a push-up and suction system, the outline of which will be described hereinunder.

In FIG. 20, the numeral 214 designates a rail formed with a groove which houses the tape-like housing body 50 longitudinally at least in part of the upper surface thereof, a through hole 215 being provided on the surface so as to coincide with the housing hole 44 of the tape-like housing body 50. The numerals 216, 217 designate a pair of sprocket wheels disposed adjacent the forward end and the rearward end of the rail 214 with a plurality of pins 218, 219 spaced round the peripheries of disk bodies respectively, the sprocket wheels 216, 217 being rotated intermittently by barrel cam and the like fitted to drive shafts not illustrated thereby constituting an intermittent feed device for intermittently feeding the housing body 50 into the direction of its travel with the pins 218, 219 engaging the feed holes 45 of the housing body 50.

The numeral 220 designates a pressure plate provided on the rail 214 for preventing the tape-like housing body 50 from bloating upwardly. The numeral 221 designates a receiving table disposed on the side of the bottom of the through hole 215 of the rail 214, the receiving table 221 being provided with a receiving hole 222 (FIG. 21) formed open at the upper face and one side thereof, the receiving hole 222 being formed with a through hole in its bottom part, a push-up rod 223 being reciprocatably fitted through said through hole. Though not illustrated, by the lateral open part of the receiving hole 222 there is disposed a linear track terminal constituting a linear feeder of the chip-form electronic parts supplying device comprising a dish ball feeder, linear feeder and the like thereby enabling the chip-form electronic part fed by the feed device to be loaded into the receiving hole 222. The push-up rod 223 constitutes a device for pushing the electronic part upwardly by means of a cam. The push-up rod 223 is reciprocated upwardly and downwardly by the cam fitted to the drive shaft driving the sprocket wheels 216, 217 thereby pushing the chip-form electronic part loaded in the receiving hole 222 of the receiving table 221 to the side of the upper surface of the rail 214 via the through hole 215 thereof until it is inserted into the open housing hole 44 of the tape-like housing body 50. The numeral 224 designates a suction holding device provided adjacent the through hole 215 of the rail 214, the suction holding device 224 comprising a head 226 having a hollow part 225 open at its bottom and porous material 227, such as alumina, disposed in the hollow part 225, the hollow part 225 being subjected to constant suction by a vacuum source (not shown) connected to a suction port 228 provided on the upper part thereof. The suction holding device 224 is adapted to hold the chip-form electronic part inserted into the housing hole of the tape-like housing body 50 by the push-up rod 223 by subjecting it to the suction of the surface of the porous material 227 thereby making it possible to position the chip-form electronic part in the housing hole of the tape-like housing body even after the push-up rod 223 has been released. The chip-form electronic part held by the suction holding device is released from the state of suction holding when the tape-like housing body 50 is intermittently fed forwardly on the rail. Synchronously, a housing hole 44 of the tape-like housing body 50 not yet loaded with a chip-form electronic part is positioned at the through hole 215 of the rail 214, the housing hole 44 being loaded with a chip-form electronic part by the push-up device 221 and the suction holding device 224. By the repetition of such operation, each of the housing holes 44 of the tape-like housing body 50 is loaded with a chip-form electronic part in regular sequence. The numeral 229 designates a first tape-like cover sheet consisting of a transparent film, such as plastics, wound round a reel (not shown) rotatably provided below the rail 214. The cover sheet 229 is drawn to the upper surface of the rail 214 via a through hole thereof from a sheet cover feed device via of a guide roll 230, the cover sheet 229 being applied to the lower surface of the tape-like housing body 50 loaded with chip-form electronic parts thereby sealing the housing holes 44. Again, the cover sheet 229 does not cover the feed holes 45. The numeral 231 designates a first heat body made of copper or the like disposed on the lower surface of the rail 214, the heat body 231 being heated by a first heater 233 at the forward end of an arm 232 pivoted on a predetermined fulcrum and forced to elastically project beyond the upper surface of the rail 214 via a through hole provided thereon by a tensile coil spring (not shown) engaged on the opposite end of the fulcrum of the arm 232 relative to the heater 233. The heat body 231 comprises a pair of projecting walls 119', 119" provided in parallel at the forward end thereof in the same manner as the heat body 119 of the first embodiment shown in FIG. 19. The projecting walls 119', 119" slightly melt the tape-like cover sheet 229 and apply it to opposite ends of the housing hole 44 of the tape-like housing body 50, respectively. In effect, the heat body 231 and the heater 233 constitute a cover sheet applying device for applying the first cover sheet 229 onto the tape-like housing body 50. The numeral 234 designates a second tape-like cover sheet consisting of a transparent film, such as plastics. The second tape-like cover sheet 234 is wound round a reel (not shown) rotatably provided above the rail 214, the cover sheet 234 being drawn from the cover sheet feed device via a guide roll 235 until it is disposed via a roll 236 on the surface of the tape-like housing body 50 loaded with chip-form electronic parts (but not over the feed holes 45) so that the housing holes 44 thereof may be sealed. The numeral 237 designates a second heat body made of copper or the like. The second heat body 237 is heated by a second heater 239 at the forward end of an arm 238 rotatable about a predetermined fulcrum, and adapted to be elastically pressed against the upper surface of the tape-like housing body 50 on the rail 214 by a tensile coil spring (not shown) engaged on the opposite end of the fulcrum of the arm 238 relative to the heater 239. The second heat body 237 is constructed similarly to the first heat body 231, and adapted to apply the tape-like cover sheet 234 to opposite ends of the housing hole 44 of the tape-like housing body 50, respectively, after slightly melting said cover sheet by heating it. In effect, the heat body 237 and the heater 239 constitute a cover sheet applying device for applying the second cover sheet 234 onto the tape-like housing body 50. The numeral 240 designates a reel provided below the rail 214 for taking up the tape-like electronic parts aggregate 156.

Figure 22:
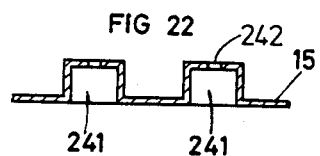
FIG. 22 is a longitudinal sectional view showing another embodiment of the tape housing body for use with the same.

The tape-like housing body 50 may have housing holes having bottoms and open on one side or may be formed with housing holes 241 having bottoms formed by stamping as shown in FIG. 22. In this case, a small opening 242 is preferably provided in the bottom of the housing hole 241 so that the chip-form electronic part may be suction-held by the suction holding device 224. The second cover sheet 234 is not necessarily required in this case.

The push-up device provided on the side of the lower surface of the through hole 215 of the rail 214 has been described in connection with the type in which the push-up rod 223 was fitted through the receiving table 221. Alternatively, however, a through hole may be provided, for example, directly in the forward end part of the linear track of the linear feeder constituting the electronic part feed device, the push-up rod being fitted through said through hole. Furthermore, a suction port connected with the vacuum source may be provided on the surface of the push-up rod 223 against which the chip-form electronic part abuts thereby enabling said part to be suction-held until the push-up operation of the chip-form electronic part has been completed.

FIG. 23 shows a third embodiment in which a chuck system has been employed in the housing part of the chip-form electronic part. The automatic producing apparatus of the said system will now be described. Parts similar to those in FIG. 3 are indicated by like reference numerals.

Figure 13:
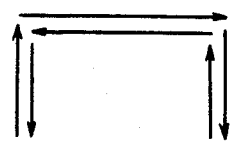
FIG. 13 is a diagram showing the movement of the chuck part of the chip-form electronic part loading device.

In FIG. 23, the numeral 301 designates a chip-form electronic part place device for loading a chip-form electronic part into the housing hole 44 of the tape-like housing body 50 disposed on the surface of the rail 63 mounted on the second stage 61. The operation of said device is same as that of the device generally made available on the market under the name of PICK & PLACEMENT UNIT, LOADING UNIT, etc. To be more precise, the chuck part 302 for taking up a chip-form electronic part at the forward end of a vibration supply device which will be described hereinafter disposed along the rail 63 by a pair of arms actuated by a groove cam or a plate cam (not shown) fitted to the drive shaft 41 (FIG. 3) and then loading said chip-form electronic part into the housing hole of the tape-like housing body is adapted to make a U-shaped reciprocating movement between the tape-like housing body 50 on the surface of the rail 63 and the vibration supply device along said rail 63 as shown in FIG. 13. The chuck 302 according to this embodiment has a pipe 303 at its upper end connected with a vacuum source through a switch valve, such as an electromagnetic valve, etc., the bottom face thereof being adapted to take up by suction the chip-form electronic part of the vibration supply device and load it into the housing hole of the tape-like housing body with the release of the suction. Apart from the suction system according to the embodiment, the chuck part 302 may be mechanically constructed, for example, with a pair of claws capable of holding the electronic part therebetween. More than 2 sets of chip-form electronic part placing devices 301 may be juxtaposed longitudinally along the tape-like housing body 50, or the chuck part 302 of the placing device 301 may be multiplied by more than two with the vibration supply device being increased accordingly. Thus the loading capacity of the chip-form electronic parts into the housing holes 44 of the tape-like housing body is increased. It is needless to mention that the feed pitch of the tape-like housing body 50 of the intermittent feed device comprising the sprocket wheels 65, 66 should be increased so as to conform with the number of placing devices 301 or that of the chuck parts 302.

Figure 25:
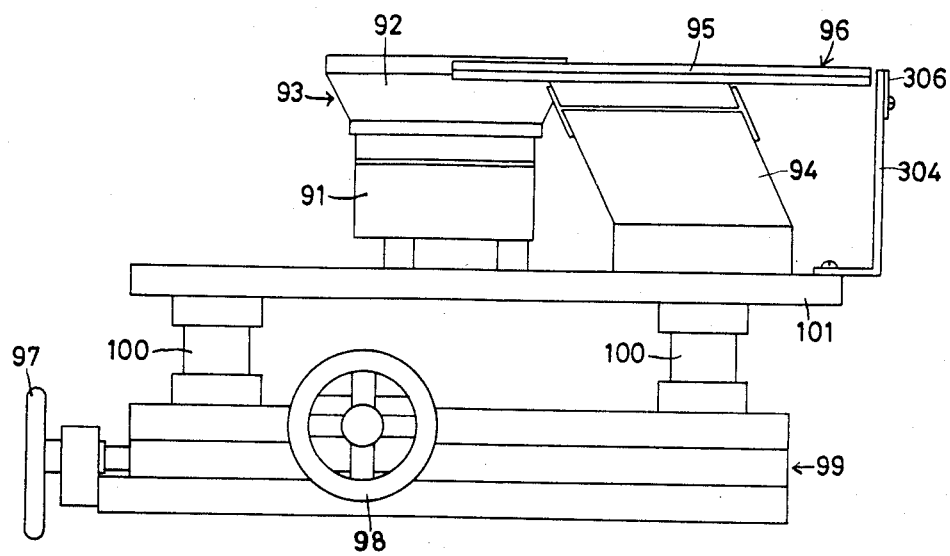
FIGS. 25 and 26 are an elevational view and a plan view, respectively, showing another example of the vibration supply device.
Figure 26:
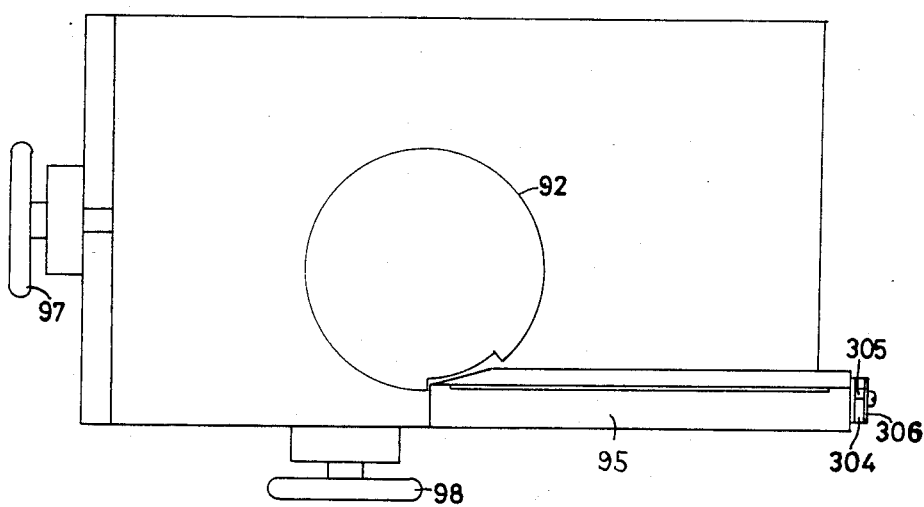

In the third embodiment, the vibration supply device for supplying chip-form electronic parts to be taken up by the chuck part 302 of the chip-form electronic part placing device disposed along the rail 63 has substantially the same construction as that of the first embodiment shown in FIGS. 16 and 17. The construction will be described hereinunder in reference to its side and plan views shown in FIGS. 25 and 26. Like parts to those in FIGS. 16 and 17 are indicated by like reference numerals, while description will be limited to the parts having different constructions.

In effect, the only difference lies in that the receiving table 304 of substantially the same height as that of the linear track 95 is provided at the terminal thereof with a slight spacing interposed therebetween. The receiving table 304 is provided in the upper part thereof with a groove 305 of the size capable of receiving a chip-form electronic part, a falling protective wall 306 being provided on the back of the groove 305, thereby enabling the electronic part fed to the rear end of the linear track 95 by vibration to be housed in the groove 305. The receiving table 304 is provided in order that, when the chip-form electronic part is taken up by the chuck part 302 of the chip-form electronic part placing device, said chip-form electronic part is in the stationary state free from the vibration. The receiving table 304, however, is not necessarily indispensable if the vibration is not very violent. When the receiving table 304 is not provided, it is necessary that the rear end of the linear track 95 be formed close so that the electronic part fed thereto may not fall outwardly, it being also necessary that said rear end be provided on its upper surface with a port through which the electronic part in the groove can be taken up by the chuck part 302. The vibration supply device having the above-described construction is disposed by the side of the rail 63 and in the position from which the chuck part 302 of the chip-form electronic part placing device 301 can take up the electronic part from the groove 305 of the receiving table 304 connected to the rear end of the linear track 95 or directly from the rear end of said linear track 95.

The automatic producing apparatus for forming a strip-like container housing chip-form electronic parts according to the invention, as described hereinbefore, makes it possible to produce such container by quickly loading the housing holes of the tape-like housing body with chip-form electronic parts and sealing the openings thereof by a cover sheet, though heretofore it has been impossible to produce such tape-like electronic parts aggregate by manual operation despite various advantages thereof.

What is claimed is:

1. Apparatus, comprising:
an intermittent feed device for intermittently feeding a tape-like housing body on a rail, said tape-like housing body having a plurality of housing holes and a plurality of feed holes formed at respective predetermined intervals therein, said tape-like housing body being fed along said rail by feed pins of said intermittent feed device which engage said feed holes;

a loading device provided along the traveling path of the tape-like housing body and adapted to load a respective chip-form electronic part into that one of said housing holes which is located at a predetermined chip insertion position each time said tape-like housing body is in a dwell period of its intermittent feed;

a cover sheet supply device for supplying at least one tape-like cover sheet to the surface of the tape-like housing body in a manner which encloses each said housing hole after a respective chip-form electronic part has been placed therein;

a cover sheet adhering device for adhering said at least one cover sheet to said housing body so as to form a strip-like container housing chip-form electronic parts; and a winding device for intermittently winding the strip-like container being fed from said intermittent feed device around a reel, said winding device being intermittently driven at a rate which is different than that of said intermittent feed device, said feed pins of said intermittent feed device being located downstream of said chip insertion position but upstream of said winding device relative to the path of travel of said tape-like housing body whereby said feed pins prevent forces placed on said container by said winding device from adversely affecting the relative positions of said housing hole located at said loading position and said loading device.

2. Apparatus as defined in claim 1, wherein said loading device comprises:

a chip-form electronic part loading body which includes an annular rotary body having an outer peripheral surface and an inner peripheral surface, said inner cylindrical surface being rotatably fitted onto an outer peripheral surface of a circular fixed head located above said tape-like housing body, said axis of rotation of said rotary body lying perpendicular to the plane of said tape-like housing body as said tape-like housing body travels past said loading device, a plurality of chip-form electronic part housing grooves open on one side thereof being provided on said outer peripheral surface of said annular rotary body with a predetermined spacing interposed therebetween, a plurality of through holes, each said through hole extending from a respective said housing groove to said inner peripheral surface;

a drive means for intermittently rotating said annular rotary body of said chip-form electronic part loading body;

a vibration supply device for consecutively placing chip-form electronic parts into respective housing grooves at the top of said chip-form electronic part loading body through the said lateral openings thereof;

a suction holding device comprising a first recess provided in said peripheral surface of said fixed head in an area facing said tape-like housing body, and in a position which sequentially communicates with said through holes as said annular rotatable body is rotated about said fixed head, and a vacuum source for absorbing the air in said first recess thereby enabling the electronic part housed in each said housing groove whose through hole communicates with said first recess to be suction-held in said housing groove; and a forced falling device including a second recess provided in said peripheral surface of said fixed head in an area adjacent said first recesss, and in a position which sequentially communicates with each said through hole as said annular rotatable body is rotated about said fixed head, and an air pressure source for supplying air pressure into said second recess, as each said housing groove reaches a position wherein its said through hole communicates with said second recess, the said electronic part housed in said housing groove is forced to fall by said air pressure out of said housing groove and into said housing hole of the tape-like housing body.

3. Apparatus as defined in claim 1, wherein each of the housing holes provided on the tape-like housing body has a bottom.

4. Apparatus as defined in claim 1, wherein each of the housing holes provided on the tape-like housing body is a through hole.

5. Apparatus as defined in claim 1, wherein the housing holes of the tape-like housing body are through holes, and said cover sheet supply device supplies first and second tape-like cover sheets to the upper and lower surface of the tape-like housing body, respectively, said cover sheet adhering device adhering said first and second cover sheets to the upper and lower surfaces of said tape-like housing body, respectively.

6. Apparatus as defined in claim 1, wherein said intermittent feed device includes a rail along which said tape-like housing body travels, and wherein the chip-form electronic part loading device loads chip-like electronic parts into said housing holes at a chip insertion position, said electronic part loading device comprising:
 a through hole provided in the rail at a location corresponding to said chip insertion position;
 an electronic part supplying device for supplying a chip-form electronic part to a first position adjacent and below the through hole;
 a push-up device adapted to push up the chip-form electronic part located at said first position through said through hole and into said chip insertion position when a housing hole of said tape-like housing body is located at said chip insertion position such that a chip-form electronic part is placed in that housing hole; and
 a suction holding device disposed above the through hole for suction-holding the chip-form electronic part pushed up into the housing hole located at said chip insertion position.

7. Apparatus as defined in claim 1, wherein said intermittent feed device includes a rail along which said tape-like housing body travels, and wherein the chip-form electronic part loading device comprises a vibration supplying device of chip-form electronic parts provided at the side of the rail and a chip-form electronic part placing device provided with a chuck part for taking up chip-form electronic part at the forward end of the vibration supplying device in order to load said electronic part into a housing hole of the tape-like housing body which is located at a chip insertion position on the upper surface of the rail.

8. Apparatus as defined in claim 1, wherein the winding device comprises:
 a reel for taking up the strip-like container housing chip-form electronic parts transported by the intermittent feed device, said reel being rotatably provided on a first axis body;
 a motor connected to the first axis body for rotating the reel;
 a tension roll provided on one end of an arm fixed to a rotatable second axis body for pressure tightening the strip-like container transported by the intermittent feed device;
 a cam body mounted on the second axis body so as to be rotatable integrally with the arm of the tension roll; and
 a pair of switches provided in locations in which they are pressed by the cam body, the location of the tension roll pressing the strip-like container being shifted as a function of the length of the portion of the strip-like container disposed between the intermittent feed device and the reel, the switches thus pressed by the cam body being actuated thereby intermittently driving the motor for rotating the reel.

9. Apparatus, comprising:
 a punching device for forming a tape-like housing body by punching a plurality of through holes and feed holes in a tape member at respective predetermined intervals along said tape-like housing body;
 a first intermittent feed device provided adjacent said punching device, said intermittent feed device engaging said through holes and intermittently feeding said tape-like housing body along a first traveling path defined by a first rail;
 a second intermittent feed device having feed pins which engage said feed holes, said second intermittent feed device intermittently feeding said tape-like housing body along a second traveling path defined by a second rail, the portion of said tape-like housing body extending between said first and second intermittent feed devices being slackened such that forces placed on said tape-like housing body by said second intermittent feed device do not affect the position of said tape-like housing body in the area of said punching device;
 a chip-form electronic part loading device provided along said second traveling path and adjacent said second intermittent feed device for loading a respective chip-form electronic part into that said through hole located at a chip insertion position each time said tape-like housing body is in a dwell period of its intermittent feed; and
 first and second cover sheet supplying devices for supplying first and second tape-like cover sheets to upper and lower surfaces, respectively, of said tape-like housing body for covering said through holes thereof, cover sheet adhering devices for adhering said first and second cover sheets to said upper and lower surfaces of said tape-like housing body, respectively, thereby forming a strip-like container housing chip-form electronic parts.

10. Apparatus as defined in claim 9, wherein the punching device comprises a first punch for forming said through holes in the tape member and a second punch for forming feed holes in said tape member, said feed holes being located at spaced intervals along said travelling path, said through holes being formed with a predetermined pitch p, and wherein said intermittent transport device is provided with a pair of feed claws aligned longitudinally along the tape member for transporting the tape member in said travelling direction by engaging the feed claws with the forward end parts of the through holes formed by the first punch, said pair of feed claws being provided in such locations as will synchronously satisfy the following conditions:
  (a) the stroke s of said pair of feed claws is between the pitch p of the through holes formed in the tape member and twice said pitch 2p; and
  (b) the number of the through holes formed in the tape member located between the forward end of the punching rod and the downstream end of the upstream feed claw relative to the travelling direction of the tape member is represented by m, the distance thereof being represented by mp, the number of the through holes of the tape member betwen said pair of feed claws being represented by n, the distance thereof being represented by np, both m and n being natural numbers, the value obtained by dividing the sum of m and n by n being a sum of a natural number and a decimal.

11. Apparatus as defined in claim 9, wherein the tape-like housing body is generally planar and wherein the chip-form electronic part loading device comprises:
  an annular rotary body rotatably fitted to the outer periphery of a circular fixed head provided above the tape-like housing body, the axis of rotation of said rotary body being perpendicular to the plane of said tape-like housing body as it is moved past said chip-form electronic part loading device;
  a plurality of chip-form electronic part housing grooves formed at spaced locations on the periphery of said rotary body, each housing groove being open on one lateral side thereof, a respective through hole extending from each housing groove to the inside of the rotary body;
  a drive means for intermittently rotating the annular rotary body;
  a vibration supplying device for sequentially supply chip-form electronic parts into respective housing grooves through lateral openings thereof;
  a suction holding device including a first recess formed in the fixed head and communicating with the through hole associated with at least one of the housing grooves located near the bottom of the rotary body and a vacuum source for absorbing the air located in said recess whereby the chip-form electronic part housed in said one of said housing grooves is suction-held via the through hole in the lower surface of the housing groove;
  a second recess formed on the periphery of the lower part of the fixed head at a location adjacent the first recess and communicating with the through hole associated with a second one of the housing grooves and an air pressure source for supplying air pressure into the second recess whereby the electronic part housed in the said second one of the housing grooves is forced out of the housing groove, the location of said first and second recesses being such that each such housing groove first communicates with said first recess and then with said second recess and such that when the housing groove communicates with said second recess, the chip-form electronic body falls into one of said through holes in said tape member.

12. Apparatus as defined in claim 9, wherein the chip-form electronic part loading device comprises:
  a through hole provided in the surface of the rail at a chip insertion position;
  an electronic part supply device for transporting chip-form electronic parts to a first position located below through hole of the rail;
  a push-up device for pushing up the chip-form electronic part located at said first position through the through hole of the rail to a position above the rail and into that through hole of the tape-like housing body which is located at the chip insertion position; and
  a suction holding device for suction holding the chip-form electronic part placed in the through hole of the tape-like housing body which is located at the chip insertion position.

13. Appparatus as defined in claim 9, wherein the chip-form electronic part loading device comprises a vibration supplying device disposed on the side of the rail and a chip-form electronic part placing device provided with a chuck part adapted to take up the chip-form electronic part at the forward end of the vibration supplying device and load it into the through hole of the tape-like housing body on the surface of the rail.

14. Apparatus as defined in claim 9, wherein the winding device comprises:
  a reel mounted on a rotatable first axis body for taking up the strip-like container;
  a motor for rotating the reel coupled to the first axis body;
  a tension roll provided at one end of an arm fixed to a rotatable second axis body and adapted to pressure-tighten the strip-like container fed by the intermittent feed device;
  a cam body fixed to the second axis body so as to rotate integrally with the arm of the tension roll; and
  a pair of switches provided in such location that they are pressed by the cam body when the cam body is in a predetermined position, the switches being actuated by the pressure of the cam body caused by the shift of the tension roll as a function of the length of the strip-like container located between the intermittent feed device and the reel, thereby intermittently driving the motor for rotating the reel.

15. Apparatus as defined in claim 9, further including a third intermittent feed device having feed pins which engage said through holes, said third intermittent feed device intermittently feeding said tape-like housing body in synchronism with said second intermittent feed device; and
  a winding device for intermittently winding around a reel said strip-like container being fed from said third intermittent feed device, said winding device being intermittently driven at a rate which is different than that of said second and third intermittent feed devices feeding intermittently said tape-like housing body, said feed pins of said third intermittent feed device being located downstream of said loading position but upstream of said winding device whereby said feed pins of said third intermittent feed device prevent forces placed on said container by said winding device from adversely affecting the relative positions of that said through hole located at said chip insertion program and said loading device.

16. Apparatus, comprising:

(A) an intermittent feed device for intermittently feeding a tape-like housing body having a plurality of housing holes formed therein at predetermined intervals;

(B) a loading device provided along the traveling path of the tape-like housing body and adapted to load a respective chip-form electronic part into each of the housing holes;

(C) a cover sheet supply device for supplying at least one tape-like cover sheet to the surface of the tape-like housing body so as to enclose each said housing hole after a respective chip-form electronic part has been placed therein;

(D) a cover sheet adhering device for adhering said at least one cover sheet to said housing body so as to form a strip-like container housing chip-form electronic parts;

(E) a winding device for winding the strip-like container around a reel;

(F) said loading device comprising:
  (1) a chip-form electronic part loading body which includes an annular rotary body having an outer peripheral surface and an inner peripheral surface, said inner cylindrical surface being rotatably fitted onto an outer peripheral surface of a circular fixed head located above said tape-like housing body, said axis of rotation of said rotary body lying perpendicular to the plane of said tape-like housing body as said tape-like housing body travels past said loading device, a plurality of chip-form electronic part housing grooves open on one side thereof being provided on said outer peripheral surface of said annular rotary body with a predetermined spacing interposed therebetween, a plurality of through holes, each said through hole extending from a respective said housing groove to said inner peripheral surface;
  (2) a drive means for intermittently rotating said annular rotary body of said chip-form electronic part loading body;
  (3) a vibration supply device for consecutively placing chip-form electronic parts into respective housing grooves at the top of said chip-form electronic part loading body through said lateral openings thereof;
  (4) a suction holding device comprising a first recess provided in said peripheral surface of said fixed head in an area facing said tape-like housing body, and in a position which sequentially communicates with said through hole as said annular rotatable body is rotated about said fixed head, and a vacuum source for absorbing the air in said first recess thereby enabling the electronic part housed in each said housing groove whose through hole communicates with said first recess to be suction-held in said housing groove; and
  (5) a forced falling device including a second recess provided in said peripheral surface of said fixed head in an area adjacent said first recess, and in a position which sequentially communicates with each said through hole as said annular rotatable body is rotated about said fixed head, and an air pressure source for supplying air pressure into said second recess, as each said housing groove reaches a position wherein its said through hole comunicates with said second recess, the said electronic part housed in said housing groove is forced to fall by said air pressure out of said housing groove and into said housing hole of the tape-like housing body.

17. Apparatus, comprising:
(A) an intermittent feed device for intermittently feeding a tape-like housing body having a plurality of housing holes formed therein at predetermined intervals, said intermittent feed device including a rail along which said tape-like housing body travels;

(B) a loading device provided along the traveling path of said tape-like housing body and adapted to load a respective chip-form electronic part into each housing hole when that housing hole is located at a chip insertion position, said electronic part loading device comprising:
  (1) a through hole provided in the rail at a location corresponding to said chip insertion position;
  (2) an electronic part supplying device for supplying a chip-form electronic part to a first position adjacent and below the through hole;
  (3) a push-up device adapted to push up the chip-form electronic part located at said first position through said through hole and into said chip insertion position when a housing hole of said tape-like housing body is located at said chip insertion position such that a chip-form electronic part is placed in that housing hole; and
  (4) a suction holding device disposed above the through hole for suction-holding the chip-form electronic part pushed up into the housing hole located at said chip insertion position;

(C) a cover sheet supply device for supplying at least one tape-like cover sheet to a surface of the tape-like housing body so as to enclose each said housing hole after a respective chip-form electronic part has been placed therein;

(D) a cover sheet adhering device for adhering said at least one cover sheet to said housing body so as to form a strip-like container housing chip-form electronic part; and (E) a winding device for winding the strip-like container around the reel.

18. Apparatus, comprising:
(A) an intermittent feed device for intermittently feeding a tape-like housing body having a plurality of housing holes formed therein at predetermined intervals;

(B) a loading device provided along the traveling path of the tape-like housing body and adapted to load a respective chip-form electronic part into each of said housing holes;

(C) a cover sheet supply device for supplying at least one tape-like cover sheet to a surface of said tape-like housing body so as to enclose each said housing hole after a respective chip-form electronic part has been placed therein;

(D) a cover sheet adhering device for adhering said at least one cover sheet to said housing body so as to form a strip-like container housing chip-form electronic part; and (E) a winding device for winding said strip-like container around a reel, said winding device comprising:
  (1) a reel for taking up the strip-like container housing chip-form electronic parts transported by the intermittent feed device, said reel being rotatably provided on a first axis body;

(2) a motor connected to the first axis body for rotating the reel;

(3) a tension roll provided on one end of an arm fixed to a rotatable second axis body for pressure tightening the strip-like container transported by the intermittent feed device;

(4) a cam body mounted on the second axis body so as to be rotatable integrally with the arm of the tension roll; and (5) a pair of switches provided in locations in which they are pressed by the cam body, the location of the tension roll pressing the strip-like container being shifted as a function of the length of the portion of the strip-like container disposed between the intermittent feed device and the reel, the switches thus pressed by the cam body being actuated thereby intermittently driving the motor for rotating the reel.

19. Apparatus, comprising:
(A) a punching device for forming a tape-like housing body by punching a plurality of through holes in a tape member at predetermined intervals;
(B) an intermittent transport device for intermittently transporting the tape-like housing body along a traveling path defined by a rail;
(C) a chip-form electronic part loading device provided along the traveling path for loading a respective chip-form electronic part into each through hole as the through hole reaches a chip insertion position;
(D) first and second cover sheet supplying device for supplying first and second tape-like cover sheets to the upper and lower surfaces, respectively, of the tape-like housing body for covering the through holes thereof;
(E) cover sheet adhering devices for adhering said first and second covers sheets to the upper and lower surfaces of the tape-like housing body, respectively, thereby forming a strip-like container housing chip-form electronic parts;
(F) a winding device for taking up the strip-like container around a reel; said winding device including:
  (1) a reel mounted on a rotatable first axis body for taking up the strip-like container;
  (2) a motor for rotating the reel coupled to the first axis body;
  (3) a tension roll provided at one end of an arm fixed to a rotatable second axis body and adapted to pressure-tighten the strip-like container fed by the intermittent feed device;
  (4) a cam body fixed to the second axis body so as to rotate integrally with the arm of the tension roll; and
  (5) a pair of switches provided in such location that they are pressed by the cam body when the cam body is in a predetermined position, the switches being actuated by the pressure of the cam body caused by the shaft of the tension roll as a function of the length of the strip-like container located between the intermittent feed device and the reel, thereby intermittently driving the motor for rotating the reel.

20. Apparatus, comprising:
(A) a punching device for forming a tape-like housing body by punching a plurality of through holes in a tape member at predetermined intervals;
(B) an intermittent transport device for intermittently transporting the tape-like housing body along a traveling path defined by a rail;
(C) a chip-form electronic part loading device provided along the traveling path for loading a respective chip-form electronic part into each through hole as the through hole reaches a chip insertion position;
(D) first and second cover sheet supplying device for supplying first and second tape-like cover sheets to the upper and lower surfaces, respectively, of the tape-like housing body for covering the through holes thereof;
(E) cover sheet adhering devices for adhering said first and second covers sheets to the upper and lower surfaces of the tape-like housing body, respectively, thereby forming a strip-like container housing chip-form electronic parts;
(F) a winding device for taking up the strip-like container around a reel; and
(G) said chip-form electronic part loading device including:
  (1) a through hole provided in the surface of the rail at a chip insertion position;
  (2) an electronic part supplying device for transporting chip-form electronic parts to a first position located below the through hole of the rail;
  (3) a push-up device for pushing up the chip-form electronic part located at said first position through the through hole of the rail to a position above the rail and into that through hole of the tape-like housing body which is located at the chip insertion position; and
  (4) a suction holding device for suction holding the chip-form electronic part placed in the through hole of the tape-like housing body which is located at the chip insertion position.

21. Apparatus, comprising:
(A) a punching device for forming a tape-like housing body by punching a plurality of through holes in a tape member at predetermined intervals;
(B) an intermittent transport device for intermittently transporting the tape-like housing body along a traveling path defined by a rail;
(C) a chip-form electronic part loading device provided along the traveling path for loading a respective chip-form electronic part into each through hole as the through hole reaches a chip insertion position;
(D) first and second cover sheet supplying device for supplying first and second tape-like cover sheets to the upper and lower surfaces, respectively, of the tape-like housing body for covering the through holes thereof;
(E) cover sheet adhering devices for adhering said first and second covers sheets to the upper and lower surfaces of the tape-like housing body, respectively, thereby forming a strip-like container housing chip-form electronic parts;
(F) a winding device for taking up the strip-like container around a reel; and
(G) said chip-form electronic part loading device including:
  (1) an annular rotary body rotatably fitted to the outer periphery of a circular fixed head provided above the tapelike housing body, the axis of rotation of said rotary body being perpendicular to the plane of said tape-like housing body as it is moved past said chip-form electronic part loading device;

(2) a plurality of chip-form electronic part housing grooves formed at spaced locations on the periphery of said rotary body, each housing groove being open on one lateral side thereof, a respective through hole extending from each housing groove to the inside of the rotary body;

(3) a drive means for intermittently rotating the annular rotary body;

(4) a vibration supplying device for sequentially supplying chip-form electronic parts into respective housing grooves through said lateral openings thereof;

(5) a suction holding device including a first recess formed in the fixed head and communicating with the through hole associated with at least one of the housing grooves located near the bottom of the rotary body and a vacuum source for absorbing the air located in said recess whereby the chip-form electronic part housed in said one of said housing grooves is suction-held via the through hole in the lower surface of the housing groove; and (6) a second recess formed on the periphery of the lower part of the fixed head at a location adjacent the first recess and communicating with the through hole associated with a second one of the housing grooves located near the bottom of the rotary body and an air pressure source for supplying air pressure into the second recess whereby the electronic part housed in the said second one of the housing grooves is forced out of the housing groove, the location of said first and second recesses being such that each such housing groove first communicates with said first recess and then with said second recess and such that when the housing groove communicates with said second recess, the chip-form electronic body falls into one of said through holes in said tape member.

* * * * *